Dec. 13, 1966 K. LIPMAN 3,291,999
ISOLATED MULTIPLE OUTPUT CIRCUIT
Filed May 15, 1961
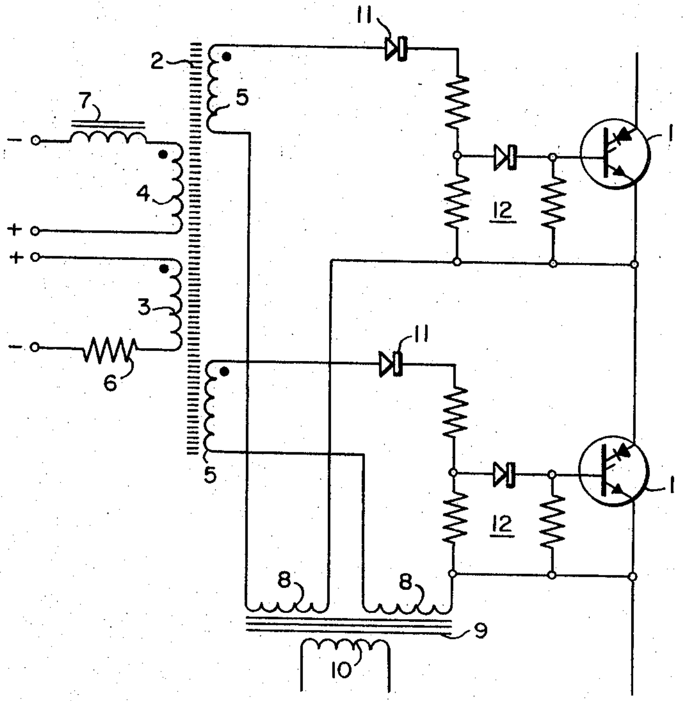
WITNESSES
Edwin E. Basler
James F. Young
INVENTOR
Kenneth Lipman
BY Ernest P. Klipfel
ATTORNEY United States Patent Office
3,291,999
Patented Dec. 13, 1966

3,291,999

ISOLATED MULTIPLE OUTPUT CIRCUIT

Kenneth Lipman, Tonawanda, N.Y., assignor to Westinghouse Electric Corporation, Pittsburgh, Pa., a corporation of Pennsylvania Filed May 15, 1961, Ser. No. 110,091
20 Claims. (Cl. 307—88)

The present invention relates generally to isolated multiple output circuits and more particularly relates to isolated multiple output circuits for driving static switching devices.

In many applications, it is desirable to fire semiconductor switching devices or other devices with identical isolated signals. It is particularly desirable to fire semiconductor devices simultaneously when the devices are connected in series circuit relationship and it is therefore necessary that all the devices function to share equally the switching of power in excess of the individual capabilities of each semiconductor device. Prior applications in this field required a duplication of elements each having only a single output thereby increasing the size, complexity, and number of components and connections which can fail.

The present invention overcomes the difficulties of the prior art by providing a plurality of identical isolated output circuits on a single magnetic amplifier core.

Accordingly, an object of the present invention is to provide a magnetic amplifier having a plurality of isolated output signals.

Another object of the present invention is to provide a magnetic amplifier for the simultaneous firing of a plurality of semiconductor switching devices.

Another object of the present invention is to provide a magnetic amplifier capable of developing a plurality of isolated outputs in a control system.

Further objects and advantages will be readily apparent from the following detailed description taken in conjunction with the drawing, in which the sole figure is an electrical schematic diagram of an illustrative embodiment of the present invention.

A magnetic amplifier has many desirable characteristics for controlling the firing angle of semiconductor switching devices. A magnetic amplifier provides good isolation between the input and output circuits. The speed of response is adequate for many applications when the semiconductor switching device is being used to control line power. However, like many other static devices, only a single output has been heretofore available from one core.

Referring to the figure, a plurality of semiconductor switching devices 1, connected in series circuit relationship, each require a separate isolated firing circuit. To supply a separate isolated firing circuit to each semiconductor device 1 a magnetic amplifier in accordance with the present invention is illustrated.

The magnetic amplifier comprises a saturable core 2 having inductively disposed thereon a bias winding 3, an input winding 4 and a plurality of load windings 5. A plurality of load circuits, each connected to fire a semiconductor device, is utilized to drive the core towards saturation and thereafter provide a gating signal to each semiconductor device. The combined effect of the windings 3 and 4 reset the core 2 to a preset flux condition. To bias the saturable core 2 to a reference value the bias winding 3 is connected across bias input terminals and includes a current limiting resistor 6. In the same manner the signal winding 4 is connected to signal input terminals through a choke 7. The resistor 6 and choke 7 limit induced currents in each of the input windings during the period that the plurality of load windings 5 are energized to drive the saturable core 2 to saturation.

Each load circuit comprises a load winding 5 and a gating power supply herein illustrated as a secondary winding 8 of a power transformer 9 energized by a primary winding 10. A rectifier 11 blocks current flow in each load winding 5 during one half cycle of the gating power supply.

The secondary windings 8 and the load windings 5 are selected so that the summation of the voltage-time integrals during a half cycle of the gating power supply will be sufficient to drive the saturable core 2 from saturation in one direction to saturation in the other direction at the highest expected line voltage. For example, the windings 5 may be supplied from a twelve volt source, but the core is chosen to saturate at fifteen volts so that no spikes appear in the output during the "off" state. As indicated by the polarity dots, the polarity of the magnetizing force of the bias circuit is opposite to that of the respective magnetizing forces of the load and signal windings. It can be seen that when the intermediate half cycles of the gating power supply are blocked by rectifiers 11, the flux condition in the core 2 is reset to a preselected level as determined by the direct current control current and bias current. The flux condition remains there until the beginning of the next alternate half cycle of the gating power supply. During each gating half cycle the core is capable of absorbing some voltage before saturating. Thus, the output from the magnetic amplifier will be determined by the firing angle as decided by the preset level of flux conditions prior to the commencement of the alternate half cycle, the gating half cycle, of the gating power supply.

The core exciting current is provided by all the load windings 5 with each winding chosen so that the change in flux through any turn on the core is almost identical, particularly in high permeability toroidal types. If volttage is applied to a winding on a core, the change in flux being identical, all windings will have nearly the same voltage across them in the ratio of their turns.

The voltages applied to each load circuit are selected so that the windings 5 on the core receive a gating voltage in the ratio of their turns and the change in flux will be almost the same as if only one winding were being driven.

The advantages gained by a circuit in accordance with the present invention are multiple. By providing the core exciting current with a plurality of load windings, the exciting current per individual load circuit is greatly reduced. When the saturable core 2 saturates, each load circuit will receive a signal within a few microseconds of each other with the errors being largely due to unbalances and residual inductances in winding capabilities which proper layout can minimize.

The characteristics of this isolated multiple output circuit are well suited to fire semiconductor devices such as silicon controlled rectifiers and other such devices utilized in a switching mode. The resulting output pulse in each load circuit is divided by voltage dropping means 12 and provided to the gate terminal of such a device. Opening and closing of each device 1 is simultaneously obtained insuring that the power interruption of the line is shared by each semiconductor with no individual switch being subjected to destructive surges by attempting to interrupt power flow in the power line beyond its switching capabilities.

While the present invention has been described with a degree of particularity for the purposes of illustration, it is to be understood that alterations, embodiments, and modifications within the spirit of the present invention are herein meant to be included. For instance, alternating current power of proper phase can be used to preset and drive the core. The net operating result would be the same.

I claim as my invention:

1. A firing circuit for a plurality of semiconductor switching devices comprising, in combination; a saturable core having a substantially rectangular hysteresis loop; control winding means inductively disposed on said core for setting the flux condition in said core; a gating circuit for each said semiconductor device comprising, a load winding for each device inductively disposed on said core; and separate supply means for energizing each said load winding for providing a control signal in each gating circuit to said semiconductor device in response to saturation of the core and in accordance with the flux condition in said core at the beginning of the driving period.

2. A magnetic amplifier for a half wave power supply comprising, in combination, a saturable core, gating means for driving said core to saturation during the half wave of said power supply; means for resetting the flux condition of said core in response to an input signal; said gating means comprising a plurality of load windings inductively disposed on said core and each having an individual load circuit connected thereto; each load circuit including an individual source of periodic voltage; each load winiding providing an output to its associated load circuit in response to said saturation and at a time dependent on the flux condition in said core at the beginning of the half cycle of power from said power supply.

3. A magnetic amplifier comprising, in combination; a saturable core; reset winding means inductively disposed on said core for presetting the flux condition of said core in response to an input signal; a plurality of load circuits each comprising in series circuit combination, a load winding, a means for connecting an alternating voltage supply to energize the load circuit, and a rectifier poled to allow current in said load circuit only during one polarity of half cycles of said voltage supply; each said load winding allowing current in its associated load circuit during said half cycles upon the saturation of said core.

4. A magnetic amplifier comprising a saturable core, and a plurality of separate load circuits for supplying a corresponding number of loads, each load circuit comprising a load winding inductively disposed on said core and individual supply means connected to the load winding for energizing the load winding to provide an output in its load circuit in response to saturation of the core.

5. The combination as in claim 4 wherein each of said load windings has connected in series therewith a unidirectional valve.

6. A magnetic amplifier comprising a saturable core, and a plurality of separate load circuits for supplying a corresponding number of loads, each load circuit comprising a load winding inductively disposed on said core and a source of periodic voltage connected to the load winding for energizing the load winding to provide an output in its load circuit in response to saturation of the core.

7. The combination as in claim 6 wherein each of said load windings has connected in series therewith a unidirectional valve.

8. A magnetic amplifier comprising a saturable core, means for presetting a desired flux level in said core, a plurality of separate load circuits for supplying a corresponding plurality of loads, said load circuits being conductively isolated from each other and each comprising a load winding inductively disposed on said core and a source of periodic voltage connected to the load winding for providing an output in its load circuit upon saturation of the core, said outputs of the respective load circuits occurring substantially simultaneously.

9. A magnetic amplifier comprising a saturable core, a plurality of separate load windings inductively disposed on said core, means individual to each load winding for supplying power to the winding, and an individual output circuit connected to each load winding, whereby all the output circuits are energized in response to saturation of the core.

10. A magnetic amplifier comprising a saturable core, a plurality of separate load windings inductively disposed on said core, an individual source of periodic power connected to each load winding, and an individual output circuit connected to each load winding, whereby all the output circuits are energized in response to saturation of the core.

11. The combination as in claim 10 wherein each of said load windings has connected in series therewith a unidirectional valve.

12. The combination as in claim 11 wherein each of said load windings has connected in series therewith a unidirectional valve.

13. A magnetic amplifier comprising a saturable core, a plurality of separate load windings inductively disposed on said core, an individual source of periodic voltage connected to each load winding, at least one of said sources supplying sufficient voltage to its associated winding to saturate said core, and an individual output circuit connected to each load winding, whereby all the output circuits are energized in response to saturation of the core.

14. A magnetic amplifier comprising a saturable core, means for setting the flux condition of said core at a desired level in response to an input signal, a plurality of separate load windings inductively disposed on said core, separate means for each load winding for supplying voltage to the load winding, and a separate output circuit connected to each load winding, whereby in response to saturation of said core all of said output circuits are energized substantally simultaneously.

15. A magnetic amplifier comprising a saturable core, means for setting the flux condition of said core at a desired level in response to an input signal, a plurality of separate load windings inductively disposed on said core, a separate source of periodic voltage connected to each load winding, at least one of said sources supplying sufficient voltage to drive said core from said level to saturation, and a separate output circuit connected to each load winding, whereby in response to saturation of said core all of said output circuits are energized substantially simultaneously.

16. Apparatus for simultaneously supplying a plurality of separate control signals to a corresponding number of devices each having a conductive state responsive to a control signal, said apparatus comprising a saturable core, a plurality of separate load windings inductively disposed on said core, a corresponding plurality of sources of periodic voltage, one connected to each load winding, at least one of said sources providing sufficient voltage to its associated winding to drive said core from a preselected flux level to saturation, each load winding being connected to a different one of said devices for supplying its associated device with a control signal in response to saturation of said core.

17. Apparatus for simultaneously supplying a plurality of separate control signals to a corresponding number of devices each device having a conductive state responsive to a control signal, said apparatus comprising a saturable core, a plurality of separate load windings inductively disposed on said core, individual means connected to each load winding for receiving a supply voltage, and a gating circuit for each of said devices for supplying its associated device with a control signal in response to saturation of said core, each gating circuit comprising a different one of said load windings and its associated individual means for receiving a supply voltage.

18. The combination as in claim 17 wherein each of said load windings has connected in series therewith a unidirectional valve.

19. Apparatus for simultaneously supplying a plurality of separate control signals to a corresponding number of devices each device having a conductive state responsive to a control signal, said apparatus comprising a saturable core, a plurality of separate load windings inductively disposed on said core, a corresponding plurality of sources of periodic voltage, one connected to each load winding, and a gating circuit for each of said devices for supplying its associated device with a control signal in response to saturation of said core, each gating circuit comprising a different one of said load windings and its associated source of periodic voltage.

20. Control apparatus comprising a plurality of devices each having a conductive state responsive to a control signal, a saturable core, a plurality of gating circuits, one for each of said devices, each gating circuit comprising a load winding inductively disposed on said core and a source of periodic voltage connected to the winding for driving said core to saturation from a preselected flux level, each of said gate circuits providing a control signal to its associated device in response to saturation of said core.

References Cited by the Examiner

UNITED STATES PATENTS

| | | | |
|---|---|---|---|
| 2,998,547 | 8/1961 | Berman | 307—88.5 |
| 3,033,997 | 5/1962 | Salihi | 307—88.5 |

BERNARD KONICK, *Primary Examiner.*

R. LAKE, *Examiner.*

J. MOFFITT, *Assistant Examiner.*